(12) United States Patent
Kim et al.

(10) Patent No.: US 7,728,554 B2
(45) Date of Patent: Jun. 1, 2010

(54) IMPULSE GENERATOR FOR OUTPUTTING NEGATIVE AND POSITIVE IMPULSES

(75) Inventors: Young-hwan Kim, Taean-eup (KR); Mi-hyun Son, Seoul (KR); Soo-yong Park, Daejeon (KR); Chang-seok Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 535 days.

(21) Appl. No.: 11/362,742

(22) Filed: Feb. 28, 2006

(65) Prior Publication Data
US 2006/0192499 A1 Aug. 31, 2006

(30) Foreign Application Priority Data
Feb. 28, 2005 (KR) .................. 10-2005-0016705

(51) Int. Cl.
*H02J 7/00* (2006.01)

(52) U.S. Cl. ................ 320/120; 320/166; 323/269; 323/272; 307/110

(58) Field of Classification Search ........... 455/91, 455/127; 320/120, 165, 166, 167; 323/271, 323/272, 269; 307/110
See application file for complete search history.

(56) References Cited

U.S. PATENT DOCUMENTS

| | | | | |
|---|---|---|---|---|
| 3,628,122 A | * | 12/1971 | Rodewald | 307/110 |
| 4,039,973 A | * | 8/1977 | Yamashiro | 331/116 FE |
| 4,258,405 A | * | 3/1981 | Steingroever | 361/156 |
| 4,596,022 A | * | 6/1986 | Stoner | 375/272 |
| 4,916,385 A | * | 4/1990 | Tomioka et al. | 324/763 |
| 5,525,907 A | * | 6/1996 | Frazier | 324/334 |
| 2002/0021574 A1 | * | 2/2002 | Ishii et al. | 363/20 |
| 2002/0167821 A1 | * | 11/2002 | Xing et al. | 363/21.11 |
| 2005/0162851 A1 | * | 7/2005 | Kazar et al. | 362/231 |

* cited by examiner

*Primary Examiner*—Edward Tso
*Assistant Examiner*—Arun Williams
(74) *Attorney, Agent, or Firm*—Sughrue Mion, PLLC

(57) ABSTRACT

An impulse generator including first and second differentiators coupled in parallel to each other, for generating impulses by differentiating a clock signal, and first and second switches for transiting on and off the first and second differentiators respectively to selectively output the impulses generated by the first and second differentiators, and varying polarity of the impulses by changing a direction of a current flowing through load. Accordingly, the negative and positive impulses are selectively output according to the circuit state, reliability of the impulses is improved, and power consumption is reduced.

17 Claims, 4 Drawing Sheets

IMPULSE GENERATOR FOR OUTPUTTING NEGATIVE AND POSITIVE IMPULSES

CROSS-REFERENCE TO RELATED APPLICATIONS

This application claims priority from Korean Patent Application No. 2005-0016705, filed on Feb. 28, 2005, the entire disclosure of which is incorporated herein by reference.

BACKGROUND OF THE INVENTION

1. Field of the Invention

The present invention relates to an impulse generator, and more particularly, to an impulse generator capable of selectively outputting one of negative and positive impulses, so as to improve reliability of the impulses and reduce power consumption.

2. Description of the Related Art

Related art ultra wide band (UWB) communication technology is a considerable next-generation wireless transmission technology achieving 100 Mbps of data transmission speed, which is much higher than the 54 Mbps transmission speed of the IEEE 802.11a standard, and consuming power below 100 mW, which is better than the low power property of the Bluetooth standard. The related art UWB communication technology uses a few GHz of frequency bandwidth, and obtains 500 Mbps to 1 Gbps of data transmission speed by the bandwidth.

The related art UWB communication technology does not use a carrier wave in data transmission and reception, but instead loads data on pulses. Each of the pulses used in data transmission and reception is comprised of 1 ns (nanosecond) to a few hundreds of ps (picoseconds) of ultrashort waves.

To generate the pulses, a related art UWB communication system uses an impulse generator as shown in FIGS. 1, 2A and 2B.

FIG. 1 is a circuit diagram illustrating one example of the impulse generator of the related art UWB communication system. The related art impulse generator generates impulses by instantaneous discharge using a transistor that is a semiconductor switching element. A capacitor CB is connected to the base of the transistor, and a DC supply source, a resistor Re and a capacitor CC are connected to the collector of the transistor. The capacitor CB connected to the base has relatively large capacity, and the capacitor CC connected to the collector has relatively small capacity.

When a square wave is input to the base of the transistor of the impulse generator, the transistor is transited to its on position, and current flows from the collector to the emitter. If a high voltage is applied to the resistor Re of the collector by the DC supply source, when the transistor is turned on, the voltage sharply falls. The impulse is instantaneously generated in the emitter by the voltage sharply falling in the collector. On the other hand, the width of the impulse varies according to the properties of the switching element used.

FIG. 2A is a circuit diagram illustrating another example of the impulse generator of the related art UWB communication system, and FIG. 2B is a graph showing flow of voltage and current input to the related art impulse generator of FIG. 2A.

As shown in FIG. 2A, the impulse generator includes a step recovery diode (SRD) and a pair of Schottky diodes $D_1$ and $D_2$. When the voltage flows forward, the SRD stores energy according to Kirchhoff's Law, and when the voltage flows backward, the SRD is maintained for a predetermined time by the energy, and then suddenly drops off. The pair of Schottky diodes $D_1$ and $D_2$ reduce the forward turn-on voltage to 0.2 to 0.3 V by using Schottky barriers, thereby minimizing power loss and achieving high speed operation.

In the impulse generator, when the forward voltage is supplied to the SRD and the backward voltage is supplied to the SRD, the SRD is maintained in the on position for a predetermined time and then suddenly drops off. When the voltage is sharply varied in the SRD, the Schottky diodes $D_1$ and $D_2$ directly discharge the supplied voltage. Therefore, the output voltage becomes zero. The impulses are generated by the output voltage that is directly discharged from the Schottky diodes $D_1$ and $D_2$.

FIG. 2B is a graph showing variations of the voltage and current of the related art SRD and generation of the impulse by variations of the voltage from the power supply source of the impulse generator. When the forward voltage is supplied from the power supply source Vin to the SRD and the backward voltage is supplied to the SRD, the current applied to the SRD flows in the backward direction for a predetermined time TD, and then suddenly flows in the forward direction. Here, TD represents the time for which the SRD maintains the on state due to the energy stored in the SRD and the capacitor, and TS represents the time required to change the backward direction to the forward direction, which is the time required to discharge the voltage from the Schottky diodes.

However, the impulse generators of FIGS. 1 and 2A only generate positive impulses due to the circuit properties. In addition, the impulse generators need power for the entire operation time, due to the properties of the transistor or the SRD, which increases power consumption.

FIG. 3A is a circuit diagram illustrating yet another example of the related art impulse generator, and FIG. 3B is a graph showing an input voltage, a current and an impulse input in the operation of the related art impulse generator. The impulse generator includes an SRD, and a transmission line branched between the SRD and the output terminal, and having its end shorted. Normally, the current is reflected in the transmission line. In the case of a radio frequency, if the end of the transmission is shorted, the Ringing phenomenon reflecting the current occurs.

When an input voltage VS is supplied to the impulse generator, the forward current iSR flows through the transmission line, and the backward current iSF is generated by reflecting the forward current iSR. Since the backward current iSF is generated by reflecting the forward current iSR, the backward current iSF has a predetermined width of a phase difference from the forward current iSR. Because of the phase difference, when the forward current iSR and the backward current iSF interfere with each other, the forward current iSR and the backward current iSF are not completely extinguished with respect to each other, but generate impulses. When the input voltage VS rectified in a pulse shape through the SRD is transited to its off position, a negative impulse is generated, and when the input voltage VS is transited to its on position, a positive impulse is generated. In addition, the forward current iSR is not completely extinguished. Thus, unnecessary pulses are generated between the negative and positive impulses.

Since the related art impulse generator generates the negative and positive impulses, the related art impulse generator cannot selectively use one of the negative and positive impulses. Furthermore, unnecessary pulses are generated between the negative and positive impulses due to the Ringing phenomenon, which reduces the reliability of the impulses.

It is thus necessary to design the impulse generator which can selectively use one of the negative and positive impulses, obtain reliability of the impulses and reduce power consumption.

SUMMARY OF THE INVENTION

The present invention provides an impulse generator which can selectively use one of negative and positive impulses, obtain reliability of the impulses and reduce power consumption.

According to an aspect of the present invention, there is provided an impulse generator, including: first and second differentiators connected in parallel to each other, for generating impulses by differentiating a clock signal; and first and second switches for turning on and off the first and second differentiators respectively to selectively output the impulses generated by the first and second differentiators, and varying polarity of the impulses by changing a direction of a current flowing through load.

The first and second differentiators include capacitors and a common resistor, respectively, and the resistor is disposed to connect one-side ends of the capacitors.

The first and second switches have their one-side ends grounded, for removing the impulses from the first and second differentiators in the turn-on state, respectively.

The first and second differentiators alternately generate positive and negative impulses, respectively.

When the first switch is turned off and the second switch is turned on, the impulse is output from the first differentiator.

When the first switch is turned on and the second switch is turned off, the impulse is output from the second differentiator with the varied polarity.

The impulse generator may further include an inverter for outputting a clock signal by inverting a pulse signal from a pulse generator in a communication system, and supplying the clock signal to the first and second differentiators.

The inverter includes an n-channel metal oxide semiconductor field effect transistor (MOSFET) and a p-channel MOSFET being connected in parallel to each other and having a common gate and a common drain.

The first and second differentiators may include capacitors and a common resistor, and the resistor is disposed to connect one-side ends of the capacitors.

The first and second switches are n-channel MOSFETs.

BRIEF DESCRIPTION OF THE DRAWINGS

The above and/or other aspects of the present invention will be more apparent by describing exemplary embodiments of the present invention with reference to the accompanying drawings, in which.

DETAILED DESCRIPTION OF THE EXEMPLARY EMBODIMENTS

An impulse generator in accordance with the exemplary embodiments will now be described in detail with reference to the accompanying drawings.

Figure 1:
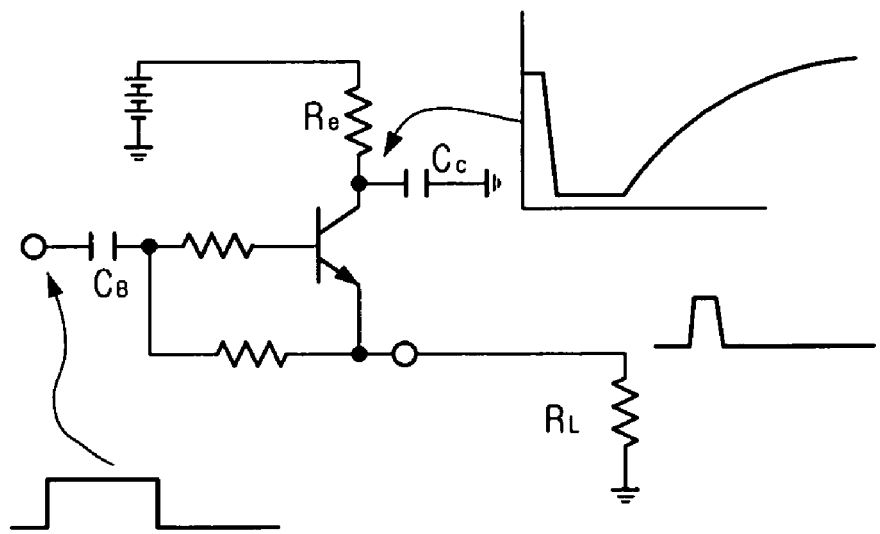
FIG. 1 is a circuit diagram illustrating one example of an impulse generator of a related art UWB communication system.
Figure 2A:
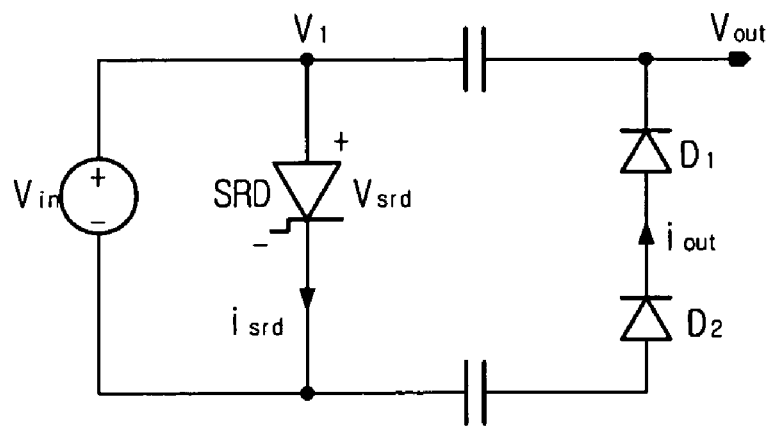
FIG. 2A is a circuit diagram illustrating another example of the impulse generator of the related art UWB communication system.
Figure 2B:
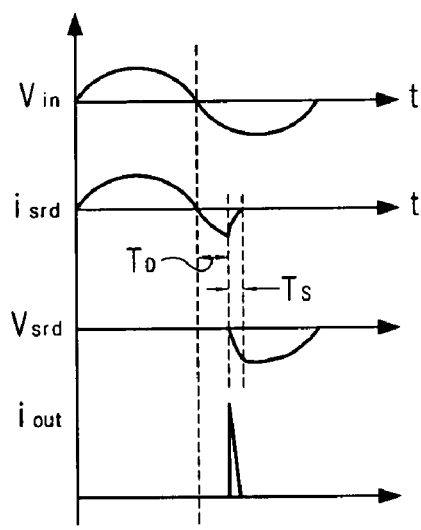
FIG. 2B is a graph showing flow of a voltage and a current input to the related art impulse generator of FIG. 2A.
Figure 3A:
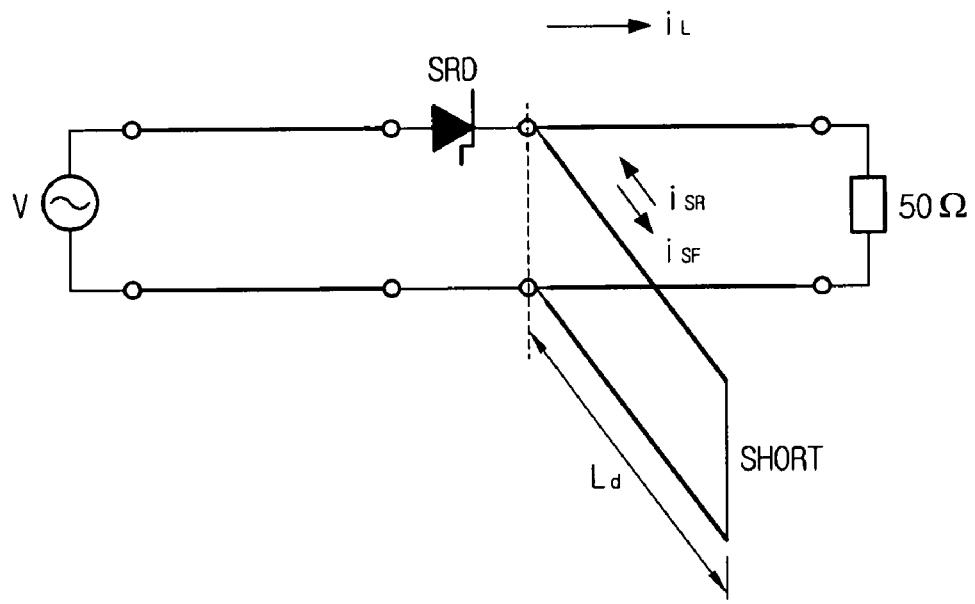
FIG. 3A is a circuit diagram illustrating another related art impulse generator.
Figure 3B:
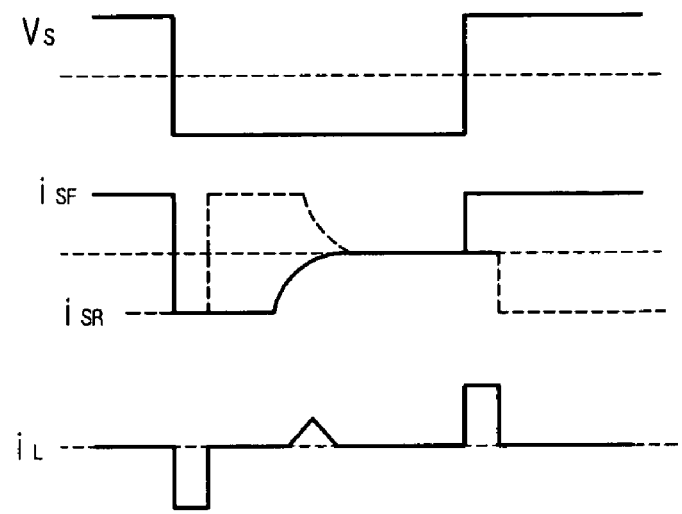
FIG. 3B is a graph showing an input voltage, a current and an impulse input in the operation of the related art impulse generator.
Figure 4:
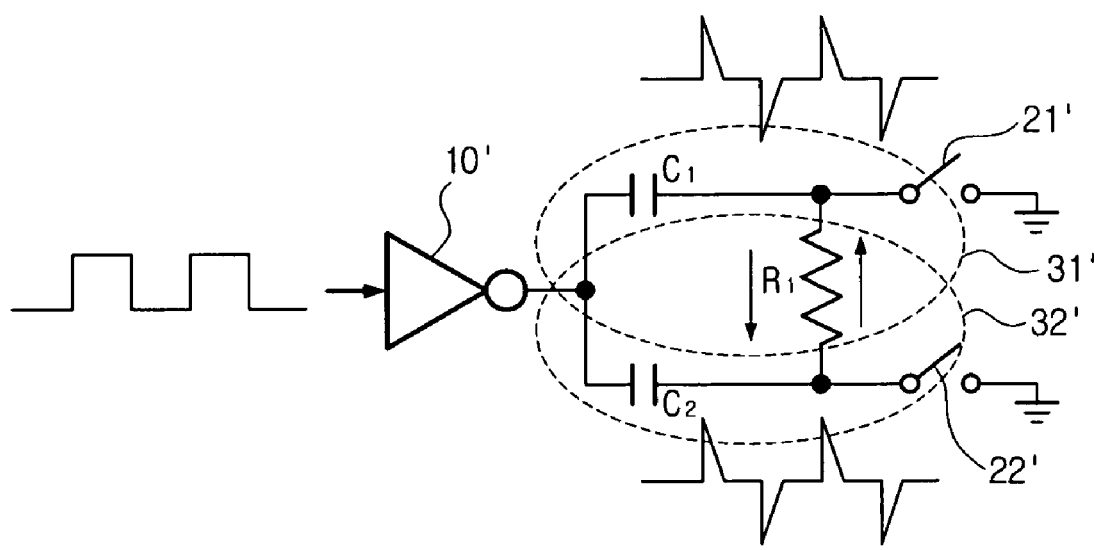
FIG. 4 is a schematic structure diagram illustrating an impulse generator in accordance with a first exemplary embodiment of the present invention.

FIG. 4 is a schematic structure diagram illustrating an impulse generator in accordance with a first exemplary embodiment. The impulse generator includes an inverter 10', and a pair of first and second differentiators 31' and 32' coupled in parallel to each other at the output terminal of the inverter 10'.

The inverter 10' receives a pulse from a pulse generator of a transmitter, and outputs a clock signal having 0 and 1 by switching the pulse.

The first and second differentiators 31' and 32' include capacitors C1 and C2 and a resistor R1. The resistor R1 of the first and second differentiators 31' and 32' is formed on the line coupling the capacitors C1 and C2 and is commonly used in each differentiator 31' and 32'. First and second switching devices 21' and 22' transiting on and off the first and second differentiators 31' and 32' and having their one-side ends grounded are located in the first and second differentiators 31' and 32', respectively.

In the impulse generator, when the pulse is input to the inverter 10', the clock signal repeatedly having 0 and 1 is generated according to the input pulse. The clock signal is differentiated through the capacitors C1 and C2 and the resistor R1 of the first and second differentiators 31' and 32', and thus converted into an impulse. The impulse is only generated in the instant of varying the clock signal from 0 to 1 and the instant of varying the clock signal from 1 to 0 (e.g., the rising edge and the falling edge).

When the clock signal is varied from 0 to 1, a positive edge is generated, and when the clock signal is varied from 1 to 0, a negative edge is generated. Accordingly, when the clock signal is varied, the positive edge and the negative edge are alternately generated in the impulse. The impulses generated in each differentiator 31' and 32' have the substantially same width and size. Although the impulses having the substantially same phase are generated in the first and second differentiators 31' and 32', since the direction of the current flowing through the resistor R1 is substantially opposite, the impulses of the first and second differentiators 31' and 32' have opposite phases in output.

On the other hand, the first and second switches 21' and 22' are used to selectively extract the positive and negative impulses among the generated impulses. For example but not by way of limitation, to extract only the positive impulse, when the positive impulse is generated in the first differentiator 31', the second switch 22' is transited to its on position to remove the impulse generated in the second differentiator 32', and the first switch 21' is transited to its off position to output the positive impulse. In addition, when the negative impulse is generated in the first differentiator 31', the first switch 21' is transited to its on position and the second switch 22' is transited to its off position. The polarity of the negative impulse generated in the second differentiator 32' is changed by variation of current flow, and thus the positive impulse is output.

As another exemplary embodiment, to extract only the negative impulse, when the negative impulse is generated in the first differentiator 31', the second switch 22' is transited to the on position to remove the impulse generated in the second differentiator 32', and the first switch 21' is transited to the off position to output the negative impulse. When the positive impulse is generated in the second differentiator 32', the second switch 22' is transited to the off position and the first switch 21' is transited to the on position.

The polarity of the positive impulse generated in the second differentiator 32' is changed by variation of current flow, and thus the negative impulse is output. As described above, the impulse from the first differentiator 31' and the impulse from the second differentiator 32' are repeatedly output, so that the positive impulse or the negative impulse can be selective extracted.

On the other hand, to mixedly output the positive and negative impulses instead of outputting one of the positive and negative impulses, for example but not by way of limitation, to sequentially generate two positive impulses and two negative impulses, the first switch 21' and the second switch 22' can be operated as follows. The first switch 21' is transited to the off position and the second switch 22' is transited to the on position to output the positive impulse from the first differentiator 31'. The first switch 21' is transited to the on position and the second switch 22' is transited to the off position to output the positive impulse from the second differentiator 32'. The first switch 21' is transited to the on position and the second switch 22' is transited to the off position to output the negative impulse from the second differentiator 32'. The first switch 21' is transited to the off position and the second switch 22' is transited to the on position to output the negative impulse from the first differentiator 31'. That is, the first positive impulse is generated by the first differentiator 31', the second positive impulse is generated by the second differentiator 32', the third negative impulse is generated by the second differentiator 32', and the fourth negative impulse is generated by the first differentiator 31'. Accordingly, the positive impulses and the negative impulses can be mixedly output by selectively transiting on and off the first differentiator 31' and the second differentiator 32'.

The operation of the impulse generator is controlled by a controller (not shown). The controller controls the on and off operations of the pulse generator for generating the pulse and the first and second switches 21' and 22', so that one of the positive and negative impulses can be selectively output.

Figure 5:
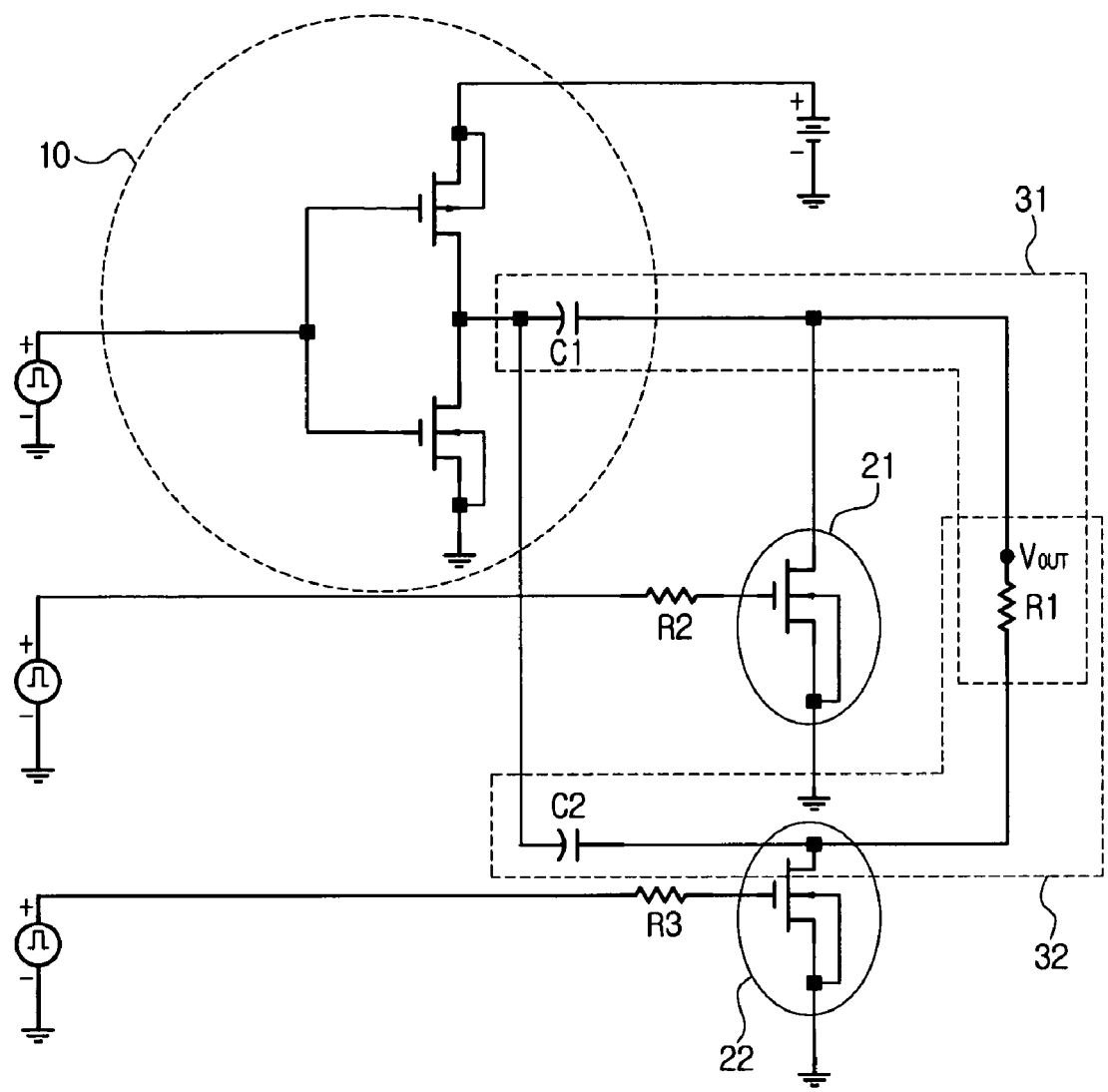
FIG. 5 is a circuit diagram illustrating an impulse generator in accordance with a second exemplary embodiment of the present invention.

FIG. 5 is a circuit diagram illustrating an impulse generator in accordance with a second exemplary embodiment. The impulse generator includes a pulse generator, an inverter 10 including a complementary metal oxide semiconductor (CMOS) driver, first and second differentiators 31 and 32, and first and second switches 21 and 22 for transiting on and off each differentiator 31 and 32.

The CMOS driver includes a pair of MOSFETs coupled in parallel to each other. One is a p-channel MOSFET and the other is an n-channel MOSFET. The MOSFETs have a common gate for receiving the pulse signal from the pulse generator. The p-channel MOSFET has a power supply source in its source terminal, for receiving power. The source terminal of the n-channel MOSFET is grounded. The drains of the MOSFETs are coupled to each other, for generating a clock signal having 0 and 1 according to the pulse signal from the pulse generator.

When the pulse signal from the pulse generator is over a turn-on voltage of the p-channel MOSFET, the p-channel MOSFET is transited to the on position and the n-channel MOSFET is transited to the off position. When the p-channel MOSFET is transited to the on position, the voltage from the power supply source is output through the drain. Therefore, the clock signal '1' is generated and supplied to the first and second differentiators 31 and 32. When the pulse signal is below the turn-on voltage of the p-channel MOSFET, the p-channel MOSFET is transited to the off position and the n-channel MOSFET is transited to the on position. Since the n-channel MOSFET is grounded, the clock signal '0' is generated and supplied to the first and second differentiators 31 and 32.

As substantially identical to FIG. 4, the first and second differentiators 31 and 32 include capacitors C1, C2 and a resistor R1. The resistor is commonly used by coupling one-side terminals of the capacitors C1, C2. The clock signal is differentiated by the first and second differentiators 31 and 32, for generating impulses alternately having a negative edge and a positive edge.

The first and second switches 21 and 22 for controlling the outputs from the first and second differentiators 31 and 32 are disposed between the capacitors C1, C2 and the resistor R1. Each switch 21 and 22 includes an n-channel MOSFET. Substantially identically to the switches of FIG. 4, the first and second switches 21 and 22 are selectively on and off according to a control signal from a controller. When the first and second switches 21 and 22 are transited to the on position, the impulses output from the differentiators coupled to the corresponding switches are grounded and removed. Accordingly, when both the first and second switches 21 and 22 are on, any impulse is not output.

The operational process of the impulse generator of FIG. 5 will now be described in detail.

When a square wave pulse is input from the pulse generator to the inverter 10, if the voltage of the pulse is over a value, the p-channel MOSFET is transited to the on position, and if the voltage of the pulse is below the value, the n-channel MOSFET is transited to the on position so as to output a clock signal sequentially having 0 and 1. The clock signal is differentiated by the first and second differentiators 31 and 32, for generating the substantially same impulses. The controller selectively transits on and off the first and second switches 21 and 22, for selectively outputting the negative impulse and the positive impulse, or transits off or on the first and second switches 21 and 22, for preventing impulse output.

For example but not by way of limitation, to generate one negative impulse, two positive impulses, one negative impulse and no impulse, the controller transits on the first switch 21 and transits off the second switch 22 to output the negative impulse from the second differentiator 32, transits on the first switch 21 and transits off the second switch 22 to output the positive impulse from the second differentiator 32, transits off the first switch 21 and transits on the second switch 22 to output the positive impulse from the first differentiator 31, transits off the first switch 21 and transits on the second switch 22 to output the impulse from the first differentiator 31, and transits on the first and second switches 21 and 22 not to output any impulse. Here, the first and second switches 21 and 22 can be transited off not to output the impulses. However, circuit stability can be maintained by removing the impulses by transiting on the first and second switches 21 and 22.

As described above, the impulse generator can output the impulses required in the circuit and improve reliability of the impulses, by selectively outputting the positive and negative impulses by using the pair of differentiators and the pair of switches. In addition, since the inverter is comprised of the CMOS driver, power is only needed in the instant of generating the impulses according to the properties of the MOSFET, which results in low power consumption.

On the other hand, the impulse generator can prevent generation of the impulses by transiting on or off the first and second switches. Therefore, the exemplary embodiments can be applied to the communication method requiring 0 signal, not the positive or negative signal.

As discussed earlier, in accordance with the exemplary embodiments, the negative and positive impulses are selectively output according to the circuit state, reliability of the impulses is improved, and power consumption is reduced.

The foregoing embodiment and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An impulse generator comprising:
    a common resistor;
    first and second differentiators which are coupled in parallel by sharing the common resistor and generate impulses by differentiating a clock signal;
    a first switch having one end which is directly connected to one end of the common resistor and another end which is directly connected to a ground; and
    a second switch having one end which is directly connected to the other end of the common resistor and another end which is directly connected to the ground;
    wherein, the first and second switches which transit on and off the first and second differentiators, respectively, to selectively output the impulses generated by the first and second differentiators, and vary polarity of the impulses by changing a direction of a current flowing through a load.

2. The impulse generator as claimed in claim 1, wherein the first differentiator comprises a first capacitor of which one end is connected to a first node between the common resistor and the first switch, and the second differentiator comprises a second capacitor of which one end is connected to a second node between the common resistor and the second switch.

3. The impulse generator as claimed in claim 2, wherein each of the first and second switches have a terminal end which is grounded to remove the impulses from the first and second differentiators in their respective turn-on states.

4. The impulse generator as claimed in claim 2, wherein the first and second differentiators alternately generate positive and negative impulses, respectively.

5. The impulse generator as claimed in claim 2, wherein when the first switch is transited off and the second switch is transited to its on position, the impulse is output from the first differentiator.

6. The impulse generator as claimed in claim 2, wherein if the first switch is transited on and the second switch is transited off, the impulse is output from the second differentiator with the varied polarity.

7. The impulse generator as claimed in claim 1, further comprising an inverter that outputs a clock signal by inverting a pulse signal from a pulse generator in a communication system, and supplies the clock signal to the first and second differentiators.

8. The impulse generator as claimed in claim 1, wherein the inverter comprises an n-channel metal oxide semiconductor field effect transistor (MOSFET) and a p-channel MOSFET which are commonly coupled in parallel and have a common gate and a common drain.

9. The impulse generator as claimed in claim 1, wherein the first and second switches are n-channel metal oxide semiconductor field effect transistor.

10. An impulse generator comprising:
    an inverter which switches a pulse of a clock signal and generates an output;
    a plurality of differentiators commonly which are coupled to receive the output from the inverter and generate a corresponding plurality of impulses; and
    a plurality of switching devices which are coupled to corresponding ones of the differentiators, wherein the switching devices are transited to an on position to substantially prevent the transmission of the corresponding plurality of impulses,
    wherein, the plurality of differentiators are coupled to each other in parallel by sharing a common resistor.

11. The impulse generator of claim 10, wherein the differentiators each comprise corresponding capacitors commonly coupled by the common resistor.

12. The impulse generator of claim 11, wherein the switching devices are grounded at one terminal thereof, so as to remove the impulses from the differentiators in their respective turn-on states.

13. The impulse generator of claim 11, wherein the differentiators alternately generate positive and negative ones of the impulses.

14. The impulse generator of claim 11, wherein if a first one of the switching devices is transited off and a second one of the switching devices is transited on, the impulses are output from one of the differentiators.

15. The impulse generator of claim 11, wherein if a first one of the switching devices is transited to its on position and a second one of the switches is transited to its off position, the impulses are output from a second one of the differentiators having a varied polarity.

16. The impulse generator of claim 10, wherein the inverter comprises an n-channel metal oxide semiconductor field effect transistor (MOSFET) and a p-channel MOSFET which are commonly coupled in parallel and have a common gate and a common drain.

17. The impulse generator of claim 10, wherein the switching devices comprise n-channel metal oxide semiconductor field effect transistors.

* * * * *